United States Patent
Tiemeijer

(10) Patent No.: US 6,246,058 B1
(45) Date of Patent: Jun. 12, 2001

(54) CORRECTION DEVICE FOR CORRECTING CHROMATIC ABERRATION IN PARTICLE-OPTICAL APPARATUS

(75) Inventor: Peter C. Tiemeijer, Eindhoven (NL)

(73) Assignee: Philips Electron Optics B.V., Eindhoven (NL)

( * ) Notice: Subject to any disclaimer, the term of this patent is extended or adjusted under 35 U.S.C. 154(b) by 0 days.

(21) Appl. No.: 09/217,220

(22) Filed: Dec. 21, 1998

(30) Foreign Application Priority Data

Dec. 22, 1997 (EP) .................................................. 97204057

(51) Int. Cl.[7] .................................................. H01J 37/153
(52) U.S. Cl. .............................. 250/396 R; 250/396 ML
(58) Field of Search ...................... 250/396 R, 396 ML, 250/398

(56) References Cited

U.S. PATENT DOCUMENTS

| | | | |
|---|---|---|---|
| 2,919,381 | * 12/1959 | Glaser | 250/396 R |
| 4,362,945 | * 12/1982 | Riecke | 250/396 ML |
| 4,684,808 | * 8/1987 | Plies et al. | 250/396 R |
| 4,962,313 | * 10/1990 | Rose | 250/396 R |
| 5,838,011 | * 11/1998 | Krijn et al. | 250/396 R |
| 5,965,894 | * 10/1999 | Krijn et al. | 250/396 R |
| 5,986,269 | * 11/1999 | Krijn et al. | 250/396 R |

\* cited by examiner

*Primary Examiner*—Bruce C. Anderson
(74) *Attorney, Agent, or Firm*—Fulbright & Jaworski LLP

(57) ABSTRACT particle-optical apparatus at a comparatively low acceleration voltage (from 0.5 kV to 5 kV). This lens defect cannot be eliminated by means of rotationally-symmetrical fields. In order to enhance the resolution nevertheless, it has already been proposed to mitigate said lens defect by means of a corrector of the Wien type. This known configuration consists of a number of electrical and magnetic multipoles. In order to adapt the corrective capacity of the corrector 28 to the strength of the objective 8 to be corrected and to achieve less severe requirements in respect of mechanical tolerances, according to the invention the corrector 28 is excited in such a manner that the trajectory of the electrons constitutes a sinusoid of a length which does not deviate more than 10% from a full sine period, upstream and downstream from the correction device there being arranged an n-pole, where n=4, 6, . . . (27, 29), at a distance which is less than ¼ of the length of the corrector.

16 Claims, 5 Drawing Sheets

CORRECTION DEVICE FOR CORRECTING CHROMATIC ABERRATION IN PARTICLE-OPTICAL APPARATUS

The invention relates to a particle-optical apparatus which includes:
a particle source for producing a beam of electrically charged particles which travel along an optical axis of the apparatus in order to irradiate an object to be irradiated in the apparatus by means of the particle beam,
a focusing lens for focusing the beam of electrically charged particles,
and a correction device for correcting lens aberrations of the focusing lens,
which correction device comprises pole faces for producing a uniform electrical field and a uniform magnetic field which extends perpendicularly thereto, both dipole fields also extending perpendicularly to the optical axis of the apparatus,
which correction device also comprises pole faces for producing an electrical quadrupole field, which pole faces extend substantially parallel to the optical axis of the apparatus.

The invention also relates to an assembly which consists of a focusing lens for focusing a beam of electrically charged particles and of correction means for correcting lens aberration of the focusing lens and is intended for use in such an apparatus.

A correction device of this kind, intended for use in such an apparatus, is known from European patent No. 0 373 399.

Generally speaking, particle-optical apparatus, such as electron microscopes or apparatus for electron lithography, are arranged to irradiate an object to be studied or worked by means of a beam of electrically charged particles (usually an electron beam) which is produced by means of a particle source such as a thermal electron source or an electron source of the field emission type. Irradiation of the object may be aimed at imaging such objects to be studied in such apparatus (specimens in electron microscopes) or at forming very small structures on the object, for example for microelectronics (electron lithography apparatus). In both cases focusing lenses are required to focus the electron beam.

The electron beam can in principle be focused in two ways. According to the first method, a specimen to be examined is more or less uniformly exposed to the electron beam and an enlarged image of the specimen is formed by means of the focusing lens. The focusing lens is in that case the objective lens of an imaging lens system; the resolution of the objective lens then governs the resolution of the apparatus. Apparatus of this kind are known as Transmission Electron Microscopes (TEM). According to a second method of focusing, the emissive surface of the electron source, or a part thereof, is imaged, be it usually strongly reduced, on the specimen to be examined (in the Scanning Electron Microscope or SEM) or on an object on which the desired microstructure is to be formed (in lithography apparatus). The image of the electron source (the "spot" which is displaced across the object by means of, for example deflection coils) is again formed by means of an imaging lens system. In the latter case the focusing lens is the objective lens of the spot-forming lens system; the resolution of this objective lens governs the spot size of the beam, and hence the resolution of the apparatus.

The lenses used in all such apparatus are usually magnetic lenses, but may also be electrostatic lenses. Both types of lens are practically always rotationally symmetrical lenses. The behavior of such lenses inevitably is not ideal, i.e. they exhibit lens aberrations, among which the so-called spherical aberration and the chromatic aberration are usually decisive in respect of resolution of the lens; these lens aberrations thus determine the limit of the resolution of the known electron optical apparatus. According to a fundamental theorem of particle optics, such lens aberrations cannot be eliminated by compensation utilizing rotationally symmetrical electrical or magnetic fields.

In contemporary electron optical apparatus, notably in scanning particle-optical apparatus comprising a spot-forming objective lens (the so-called Scanning Electron Microscope or SEM), there is a tendency to select the acceleration voltage of the electron beam so as to have a value which is lower than was customary thus far, i.e. of the order of magnitude of from 0.5 kV to 5 kV instead of the previously customary voltage of the order of magnitude of 30 kV or more. The reason for doing so is that at such comparatively low acceleration voltages the charging of non-conductive specimens (such as photoresist material in the case of manufacture of electronic integrated circuits) is substantially reduced; moreover, at these low voltages the so-called topographic contrast can be substantially enhanced. At such low acceleration voltages the chromatic aberration is the major lens aberration, and hence the decisive factor in respect of resolution of the particle-optical apparatus. (This can be readily understood by considering the fact that chromatic aberration is proportional to $\Delta U/U$, in which the $\Delta U$ is the non-variable energy spread in the electron beam and U is the nominal acceleration voltage; this factor, therefore, increases as U is decreased.)

In order to enhance the resolution of the particle-optical apparatus nevertheless, the cited European patent No. 373 399 proposes to reduce said lens aberrations by means of a correction device having a non-rotationally symmetrical structure. This structure is formed by a Wien-type corrector, that is to say a structure in which a uniform electric field and a uniform magnetic field which extends perpendicularly thereto are both oriented perpendicularly to the optical axis of the apparatus. For the correction of spherical aberration as well as chromatic aberration, this corrector is provided with a number of multipoles, i.e. an electrical and a magnetic quadrupole, an electrical and a magnetic hexapole, and an electrical and/or a magnetic octupole. (Thus, in this known correction device it may occur that only the electrical field or only the magnetic field of the octupole fields is present.)

An embodiment of the correction device according to the cited European patent (described with reference to FIG. 5 and denoted therein by the reference numeral 20) enables correction of the chromatic aberration. This embodiment consists of a multipole unit which is formed by a number of electrical and magnetic poles whose pole faces are axially oriented, i.e. they extend parallel to the optical axis of the apparatus. Each of said poles can be separately excited; by suitably choosing the individual excitations, therefore, a multipole unit thus constructed can form, as desired, a uniform electrical field extending perpendicularly to the optical axis and a uniform magnetic field which extends perpendicularly thereto, both fields extending perpendicularly to the optical axis; thereon superposed electrical and magnetic quadrupole fields, hexapole fields and an electrical and/or a magnetic octupole field can be formed.

In such a comparatively complex correction device it is extremely difficult to find the correct electrical and magnetic adjustment for the (very accurate) generation of said multipole fields. This difficulty becomes more serious as the number of multipole fields to be generated is greater, because each of these fields must have and retain exactly the adjusted correct value. Therefore, it is of essential importance to minimize the number of multipole fields required. It is an object of the invention to provide a particle-optical apparatus of the kind set forth in which correction for the chromatic aberration of the focusing lens takes place and in which the requirements in respect of electrical and magnetic adjustment and reproducibility can be more readily satisfied. To this end, the particle-optical apparatus according to the invention is characterized in that the strengths of the electrical and the magnetic fields in the correction device are such that in the correction device the electrically charged particles travel along a sinusoidal trajectory which consists of i full sine periods (i=0, 1, 2, . . . ) plus a sine line whose length does not deviate more than 10% from a full sine period, and that upstream as well as downstream from the correction device there is provided an n-pole, where n=4, 6, . . . , which is arranged at a distance $D_1$ and $D_2$, respectively, from the correction device, $D_1$ and $D_2$ being smaller than (¼) L, where L is the length of the pole faces governing the uniform fields in the direction of the optical axis (4).

The invention is based on the insight that for the various fields in the correction device a strength can be found at which the chromatic aberration is corrected and which requires the use of dipole fields and quadrupole fields only. As a result, only a limited number of power supplies is required, so that the number of variables involved in the adjustment of the correction device is substantially smaller than in the correction device which is known from the cited European patent.

The strengths of the electrical and the magnetic fields in the correction device can be selected in such a manner that in the correction device the electrically charged particles follow a sinusoidal path which consists of i full sine periods. The field strengths can now be varied in such a manner that the electrons follow a path which does not comprise an integer number of periods, but an integer number of periods plus a part of a sine line. This additional part of the sine line may exhibit a small (less than 10%) deviation from a full period (so at least 10% less and no more than 10% more than a full period). This creates the possibility of adapting the chromatic aberration of the correction device to the (variable) strength of the objective lens to be corrected. This is because it can be demonstrated that in the case of full correction of the chromatic aberration it holds for the ratio $r_{corr}/r_{obj}$ ($r_{corr}$ is the distance between the optical axis and a particle leaving the correction device and $r_{obj}$ is the distance between the optical axis and the relevant particle when it enters the objective) that:

$$r_{corr}/r_{obj} = \sqrt{(-C_{c,corr})/(C_{c,obj})},$$

where $C_{c,corr}$ and $C_{c,obj}$ are the coefficients of chromatic aberration of the correction device and of the objective, respectively. This demonstrates that upon variation of the strength of the objective, so of $C_{c,obj}$ the value of $r_{corr}$ can be varied in such a manner that the equality is maintained, so that full correction of the chromatic aberration is maintained. A variable $C_c$ correction can thus be achieved by varying the divergence or the convergence of the beam. This phenomenon will be described in detail with reference to FIG. 3.

Another important advantage of the steps proposed according to the invention resides in the fact that the rather strict mechanical manufacturing tolerances of the correction device may become less severe. This can be illustrated on the basis of the following numerical example. In a practical situation, involving a beam path parallel to the axis, the length L of the correction device is 120 mm and $r_{corr}=r_{obj}=50$ μm. If the length of the correction device is reduced to one half, L=60 mm, $C_{c,corr}$ becomes twice as large.

This is circumvented by selecting a diverging beam with $r_{corr}=35$ μm and $r_{obj}=50$ μm. (It is to be noted that fixing the desired resolution of the objective also fixes the angle of aperture of the objective, and hence also $r_{obj}$.) Consequently, the beam will be situated less far from the optical axis in the correction device, so that fewer large image aberrations will occur due to field deviations, if any, caused by mechanical imperfections. Consequently, the advantage consists in that the length of the correction device can be halved and that hence the mechanical tolerances are less severe. Due to said reduction of the length of the correction device, however, the beam is disturbed; this could have an adverse effect on the resolution of the overall system. This phenomenon can be compensated by providing an n-pole, where n =4, 6, . . . , upstream and downstream from the correction device at a distance $D_1$ and $D_2$, respectively, from the correction device, where $D_1$ and $D_2$ are smaller than (¼) L, where L is the length, in the direction of the optical axis, of the pole surfaces determining the multipole fields. Considering the latter requirement, generally speaking, the use of the stigmators already present in the apparatus for this purpose is precluded. Tests performed with the assembly consisting of the correction device, the n-poles and the objective according to the invention have demonstrated that satisfactory operation is achieved with $D_1$ and $D_2$ smaller than (¼) L.

It is to be noted that a first-order approximation of the trajectory of the particles of the beam has the shape of a sinusoid, the starting point and the end point being dependent on the height and the direction with which the particle enters the field to be traversed. Thus, depending on the initial situation, the trajectory could also be considered to be co-sinusoidal. In the context of the present invention a sinusoidal trajectory of the particles of the beam is to be understood to mean a trajectory which is shaped as a part of a sinusoid, regardless of the initial height and the initial slope of this trajectory, so regardless of the value of the argument of the sine line at which it commences and stops.

It is to be noted that a correction device as disclosed in the introductory part of claim 1 is described in the non-prepublished international patent application WO IB97/00854 (corresponding US application Ser. No. 08/932981, now patent No. 5,986,629) in the name of applicant of the present application. In this previous patent application it is stated that the length L, in the direction of the optical axis, of the pole faces governing the multipole fields is substantially equal to $(2\pi^2 n^2)/(K_{obj}^2 C_{c,obj})$. Thus, the latter configuration achieves neither the effect that the chromatic aberration of the correction device can be adapted to that of the objective nor the effect that the mechanical tolerances are less severe.

According to a further version of the invention, the electrical and the magnetic fields in the correction device have a strength such that in the correction device the electrically charged particles follow a sinusoidal trajectory which consists exclusively of a sine line whose length does not deviate more than 10% from a full sine period. For the strength of said fields thus adjusted, the dimension of the correction device, i.e. the length L, has a minimum value, so that the requirements imposed as regards the mechanical tolerances can be most readily satisfied; moreover, this minimum value of L is of importance with a view to building the device into a particle-optical apparatus.

According to a preferred embodiment of the invention, the quadrupole field is exclusively an electrical field.

It is attractive to generate the desired fields as electrical fields as much as possible. This is because the generation of magnetic fields always requires the use of poles of a ferromagnetic material which inevitably exhibit magnetic hysteresis which, moreover, often is also time dependent, and also have a non-linear magnetic behavior, i.e. the field strength of the magnetic field produced by said material is not directly proportional to the excitation current through the coils whereby said field is generated; such a non-linear behavior is undesirable with a view to achieving accurate adjustment of the field. Furthermore, due to the finite magnetic permeability of these materials, the magnetic field generated by means of this material is dependent on the location within the material; in other words, the pole faces do not exactly form a surface of constant and uniform magnetic potential, so that in such a case the field shape that could be expected on the basis of the design of the pole structure will not be obtained exactly. It is a fundamental aspect that in any case a uniform magnetic field is present in the correction device according to the invention; all other fields, however, may be electrical fields.

If the particle-optical apparatus is a scanning particle-optical apparatus with a spot-forming objective lens, it is advantageous to arrange the particle source ahead of the objective lens, looking in the direction from the correction device. The correction device can then be arranged as near to the objective lens as possible, so that any residual image artefacts, due to the finite distance between the correction device and the objective, are not unnecessarily enlarged. If necessary, a set of deflection coils for the scanning motion of the beam can then be arranged between the correction device and the objective; these coils are comparatively small and the distance between the correction device and the objective is not or only hardly increased thereby. Therefore, the correction device can thus be arranged as near to the objective lens as possible.

The invention will be described in detail hereinafter with reference to the Figures. Therein, FIG. 1 shows diagrammatically a relevant part of a particle-optical instrument in which the correction device according to the invention can be used;

FIG. 4c is a more detailed (partial) cross-sectional view of the correction device according to the invention, taken along the line A—A in FIG. 4a.

Figure 1:
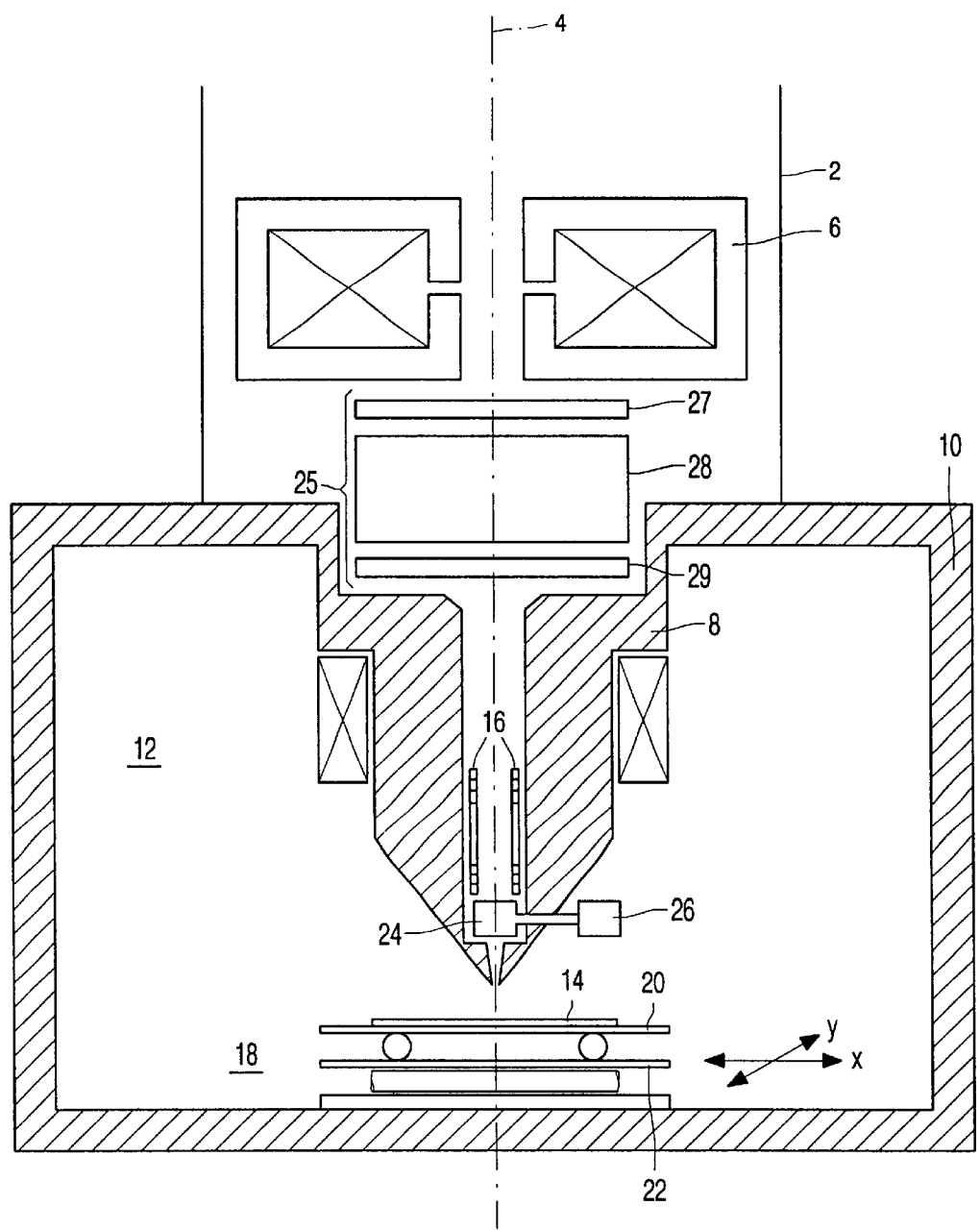

FIG. 1 shows a particle-optical instrument in the form of a part of a column 2 of a scanning electron microscope (SEM). As is customary, an electron source (not shown in the Figure) in this instrument produces a beam of electrons which travels along the optical axis 4 of the instrument. This electron beam can pass through one or more electromagnetic lenses, such as the condensor lens 6, after which it reaches the objective lens 8. This lens, being a so-called monopole lens, forms part of a magnetic circuit which also consists of the wall 10 of the specimen chamber 12. The objective lens 8 is used to form, via the electron beam, a focus whereby an object, being the specimen 14, is scanned. Scanning takes place by moving the electron beam across the specimen in the x direction as well as in the y direction by means of scan coils 16 provided in the objective lens 8. The specimen 14 is arranged on a specimen table 18 which comprises a carrier 20 for the x displacement and a carrier 22 for the y displacement. Using these two carriers, a desired region of the specimen can be selected for examination. Imaging in this microscope is realized in that secondary electrons are released from the specimen, which electrons move back in the direction of the objective lens 8. These secondary electrons are detected by a detector 24 which is provided in the bore of this lens. A control unit 26 is connected to the detector in order to activate the detector and to convert the current of detected electrons into a signal which can be used to form an image of the specimen, for example by means of a cathode ray tube (not shown). Between the condensor 6 and the objective lens 8 there is arranged a correction system 25 (to be described in detail hereinafter) for the correction of the chromatic (and, if desired, also the spherical) aberration of the objective lens. The correction system 25 consists of a correction device 28, an n-pole 27 which is arranged in front of the correction device at a short distance therefrom, and an n-pole 29 which is arranged behind the correction device at a short distance therefrom. The correction system 25 and its operation will be described in detail hereinafter with reference to the FIGS. 2 to 4.

Figure 2A:
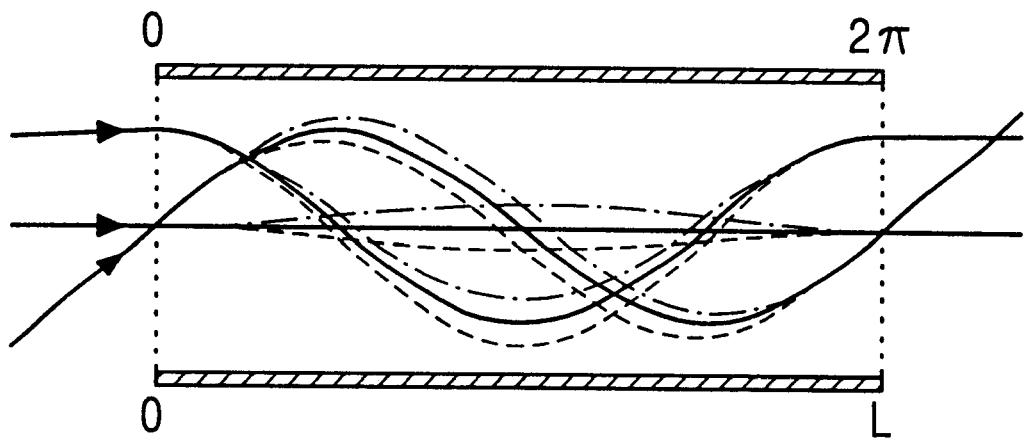
FIGS. 2a and 2b show diagrammatically, in two mutually perpendicular planes, the trajectory of some electron rays as a sinusoid of exactly one period in a correction device without additional n-pole devices at a small distance from the correction device.
Figure 2B:
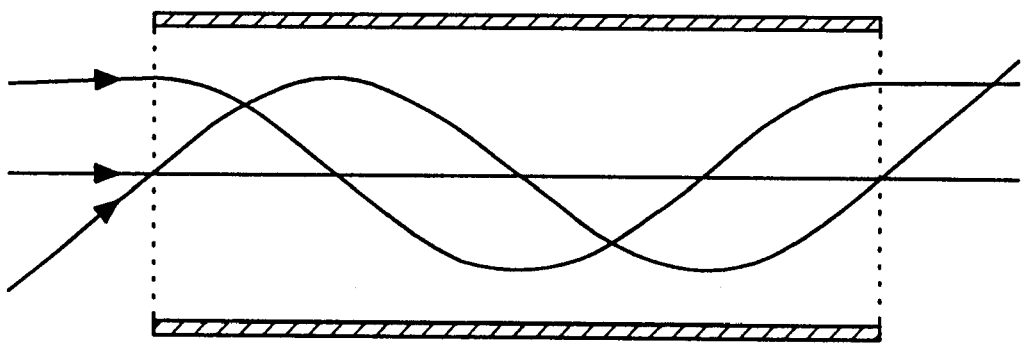

The correction behavior of a correction device of the Wien type will first be described on the basis of a course of the electron trajectory with a sine period of exactly one or more periods; the invention will be described after that. This explanation will be given with reference to the below expressions (1)–(14). FIG. 2 shows the trajectory of some electron rays with a sinusoid of one period in a correction device of the Wien type. FIG. 2a shows the trajectory in a plane through the optical axis and FIG. 2b shows that in a plane perpendicular to the former plane. The former plane is referred to as the x-z plane, the x direction extending parallel to the electrical field lines of the electric dipole whereas the z direction is the direction of the optical axis. The solid lines represent the trajectories of electrons having a nominal energy of 1 keV; the dash-dot lines represent the trajectories of electrons having a deviation of 0.2 eV with respect to the nominal energy. In both Figures a pole length (i.e. the length of the correction unit) of 120 mm has been assumed.

The x-z plane shown in FIG. 2a is the symmetry plane of the electrical multipoles. Magnetic multipoles, if any, extend perpendicularly to these electrical multipoles. The plane extending perpendicularly to the x-z plane, that is to say the plane shown in FIG. 2b, is referred to as the y-z plane.

The first-order equation of the electron trajectories in the x-z plane of FIG. 2a is:

$$x(z) = x_0 \cos(\kappa z) + x_0' \frac{1}{\kappa} \sin(\kappa z) + \frac{\Delta U}{U_0} \frac{\sqrt{2}}{2} \frac{1}{\kappa} [1 - \cos(\kappa z)] \quad (1)$$

whereas for the first-order equation of the electron trajectories in the y-z plane according to FIG. 2b it holds that $$y(z) = y_0 \cos(\kappa z) + y'_0 \frac{1}{\kappa} \sin(\kappa z) \qquad (2)$$

The symbols in the expressions (1) and (2) have the following meaning:

x, y and z are the position co-ordinates of the relevant electron;

$x_0$ and $y_0$ are the values of x and y, respectively, at the location z=0, i.e. at the entrance of the correction device;

$x'_0$ and $y'_0$ are the slope in the z direction of the trajectory in the x plane and the y plane, respectively, at the location z=0;

$\Delta U$ is the deviation of the energy of the electrons with respect to the nominal energy $U_0$, and $\kappa = (E_1 \sqrt{2})/(4U_0)$, in which $E_1$, is the coefficient of the term $-x$ in the series development of the electrical potential to x and y.

The expressions (1) and (2) show that in the correction device dispersion occurs only in the x-z plane (the variable $\Delta U$ occurs only in the expression (1)) and that the y-z plane is free from dispersion.

The adjustment of the correction device, i.e. the choice of the values of the currents and voltages whereby the poles are excited, is based on the following criteria.

First of all there is the requirement that an electron of nominal energy $U_0$ on aggregate may not experience deflection in the correction device. This means that an electron of nominal energy which initially follows the optical axis again has to travel along the optical axis after its departure from the correction device. This requirement is satisfied if:

$$E_1 - v_0 B_1 = 0 \qquad (3)$$

The symbols in the expression (3) which have not yet been explained have the following meaning:

$B_1$ is the coefficient of the term $-y$ in the series development of the magnetic potential to x and y; and $v_0$ is the velocity of the electron associated with the accelerating potential $U_0$.

If the expression (3), the so-called Wien condition, is satisfied, the electrical and magnetic quadrupole components must be chosen in such a manner that, moreover, the requirement is satisfied that the behavior of the correction device in the x-z plane should be the same as its behavior in the y-z plane; this is referred to as the double focusing condition. This condition is:

$$E_2 - v_0 B_2 = -\frac{E_1^2}{8U_0} \qquad (4)$$

The symbols in the expression (4) which have not yet been explained have the following meaning:

$E_2$ is the coefficient of the term $-(x^2-y^2)$ in the series development of the electrical potential to x and y, and $B_2$ is the coefficient of the term $-2xy$ in the series development of the magnetic potential to x and y.

For a selected value of $E_1$ the expression (4) establishes a relationship between $E_2$ and $B_2$ where one of these two can still be chosen as desired. Because of the already mentioned drawbacks of magnetic poles, preferably electrical fields are used wherever possible. Therefore, the term $B_2$ is preferably chosen to be equal to zero. The expression (4) then becomes:

$$E_2 = -\frac{E_1^2}{8U_0} \qquad (5)$$

In order to ensure, moreover, that the correction device does not exhibit dispersion from its entrance to its exit, the last term in the expression (1), being proportional to $\Delta U/U_0$, must be equal to zero. For a correction device of length L this requirement is satisfied if $\kappa = n \cdot 2\pi/L$, or with $\kappa = (E_1\sqrt{2})/(4U_0)$:

$$E_1 = n \cdot 4\pi\sqrt{2} \frac{U_0}{L} \qquad (6)$$

For n=1, the expression (6) is called the $2\pi$ condition.

For correction of the chromatic aberration it is necessary to satisfy the condition that the chromatic aberration of the correction device is rotationally symmetrical. This condition is called the absence of chromatic astigmatism condition. This condition can be expressed in a formule as:

$$E_3 - v_0 B_3 = -\frac{E_1^3}{32 U_0^2} - \frac{E_1 E_2}{4 U_0} \qquad (7)$$

The symbols in the expression (7) which have not yet been explained have the following meaning:

$E_3$ is the coefficient of the term $-(x^3-3xy^2)$ in the series development of the electrical potential to x and y, and $B_3$ is the coefficient of the term $-(3x^2y-y^3)$ in the series development of the magnetic potential to x and y. If the term $B_2$ is chosen to equal zero, insertion of the expression (5) in the expression (7) makes the right-hand term of the expression (7) zero:

$$E_3 - v_0 B_3 = 0 \qquad (8)$$

The expression (8) thus obtained establishes an unambiguous relationship between $E_3$ and $B_3$. Using these values for $E_3$ and $B_3$, the chromatic aberration of the correction device becomes:

$$C_{c,corr} = \frac{-(2\pi n)^2}{L K_{obj}^2}\left[1 + \frac{4 E_2 U_0}{E_1^2}\right] \qquad (9)$$

The symbols in the expression (9) which have not yet been explained have the following meaning:

$C_{c,corr}$ is the coefficient of chromatic aberration of the correction device, and $K_{obj}$ is the strength of the objective to be corrected; this value equals the reciprocal value of the focal distance $f_{obj}$.

The expression (5) represents the relationship between $E_1$, and E2; combination of the expressions (5) and (9) yields:

$$C_{c,corr} = -\frac{2\pi^2 n^2}{L K_{obj}^2} \qquad (10)$$

It is also desirable that the spherical aberration of the correction device itself is rotationally symmetrical. This condition leads to two requirements. The first requirement is called the absence of axial astigmatism condition and the second requirement is called the absence of axial star aberration condition. Combination of these two requirements yields the following two expressions:

$$E_3 = \frac{10E_2^2}{9E_1} - \frac{E_1^3}{72U_0^2} + \frac{E_1 E_2}{36 U_0} \tag{11}$$

and $$E_4 - v_0 B_4 = -\frac{29}{4608} \frac{(E_1^2 + 8E_2 U_0)^2}{U_0^3} \tag{12}$$

The symbols in the expression (12) which have not yet been explained have the following meaning:

$E_4$ is the coefficient of the term $-(x^4-6x^2y^2+y^4)$ in the series development of the electrical potential to x and y, and $B_4$ is the coefficient of the term $-(4x^3y-4xy^3)$ in the series development of the magnetic potential to x and y.

When the expression (5) is inserted for $E_2$ in the expression (11), it appears that $E_3$ becomes equal to zero. It appears from the expression (8) that $B_3$ also becomes zero, so that no third-order terms at all need be present (so no hexapoles from a physical point of view). Furthermore, when the expression (5) is inserted for $E_2$ in the expression (12), it appears that the right-hand term of the expression (12) becomes equal to zero, so that $E_4-v_0B_4=0$. Further calculation shows that no contradiction arises with respect to other conditions if $E_4$ and $B_4$ are both chosen to be equal to zero. In that case no fourth-order terms at all need be present (so no octupoles from a physical point of view).

If the conditions for the multipole fields according to the expressions (3) to (12) have been satisfied, the expression for the spherical aberration of the correction device itself (for the case n=1) is given by $$C_{s,corr} = \frac{K_{obj}^2 C_{c,corr}^3}{\pi^2} \tag{13}$$

The symbols in the expression (13) which have not yet been explained have the following meaning:

$C_{s,corr}$ is the coefficient of spherical aberration of the correction device itself.

In respect of the sign of the coefficient of spherical aberration it is to be noted that it is chosen so that it is positive for a rotationally symmetrical lens. This means that in conformity with the expression (13) the correction device itself has a negative coefficient of spherical aberration. The numerical value of this coefficient, however, is much smaller than that of the objective to be corrected. Therefore, this correction device is not capable of correcting spherical aberration of the focusing lens. However, such correction can be performed by maintaining the hexapole fields in the correction device according to the invention, by splitting the correction device thus obtained into two equal sections, each having half the length, and by adding a hexapole field of opposite intensity to each of said halves as described in a patent application in the name of Applicant which has not yet been published at the date of filing of the present patent application (patent application WO IB97/00513, corresponding U.S. application Ser. No. 08/861345now Pat. No. 5,850,011).

This completes the description of the behavior of a correction device of the Wien type with reference the expressions (1)–(13). When the excitation of the various poles in such a correction device is varied in such a manner that the trajectory of the electrons no longer amounts to exactly an integer number of periods but is allowed instead to assume a value which deviates therefrom, the invention creates the possibility of making the electron beam leave the correction device in a diverging or converging fashion so that, using the correction device, the correction of the chromatic aberration can be adapted to the strength and hence to the changed chromatic aberration of the objective lens to be corrected. It is to be noted that this effect could also be achieved by making the electron beam enter the correction device in a diverging or converging fashion (so that the beam would travel exactly an integer number of sinusoidal periods in the correction device), but it has been found that such an asymmetrical trajectory degrades the image quality.

Figure 3A:
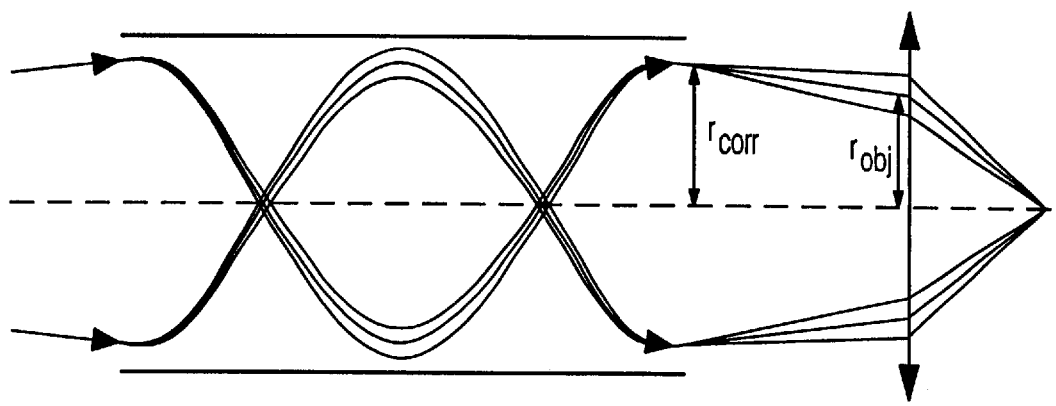
FIGS. 3a and 3b show diagrammatically, in one plane, the trajectory of some electron rays as a sinusoid which deviates from exactly one period in a correction device without additional n-pole devices at a slight distance from the correction device.
Figure 3B:
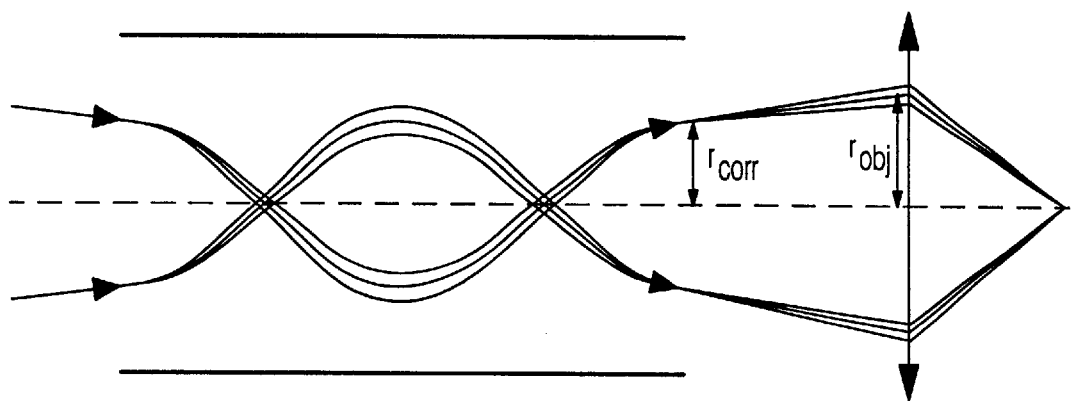

The beam path (so the trajectory of the electrons) in the correction device is then as shown in the FIGS. 3a and 3b. In both Figures the beam path is given only for the x-z plane, because the dispersion occurs in this plane (see also FIG. 2). FIG. 3a shows the situation involving a diverging electron beam which enters the correction device with a given energy spread, whereas FIG. 3b shows the situation involving a converging electron beam which enters the correction device with the same energy spread. It can be demonstrated that the chromatic aberration of the correction device and that of the objective can be adapted to one another by making the beam leave the correction device in a diverging or converging fashion. This relationship can be derived on the basis of the paraxial imaging equation for the objective (1/b+1/v=1/f; b=focal length, v=object distance), assuming that the focal length b for the objective is constant. A similar procedure can be used for the correction device, assuming that the object distance v for the correction device is constant. Using variation of v and f it then follows that the total chromatic aberration of the combination consisting of the correction device and the objective equals zero if the following equation is satisfied:

$$\frac{C_{c,corr}}{C_{c,obj}} = -\frac{r_{obj}^2}{r_{corr}^2} \tag{14}$$

The expression (14) shows that the compensating power of the correction device can be adapted to the value of the chromatic aberration $C_{obj}$ of the objective by the choice of the divergence or convergence angle (so the ratio of $r_{obj}$ to $r_{corr}$). As has already been described, the length of the correction device can be substantially reduced by abstaining from the requirement that the electron ray must complete exactly one period in the correction device. By making the correction device much shorter (for example, half the length), its (negative) coefficient of chromatic aberration becomes much larger (for example, twice as large) as appears also from the expression (10). This problem is mitigated by choosing a diverging or converging beam. As a result of said reduction of the length of the correction device, however, dispersion occurs which would seriously degrade the resolution of the entire system. This dispersion can be eliminated by making the quadrupole which is already present in the correction device slightly stronger relative to the nominal value as given by the expression (5). However, the intensification of the quadrupole field renders the correction device astigmatic, so that the resolution would be degraded once more. The latter effect can be compensated by providing an n-pole (notably a stigmator, so an n-pole with n=4) upstream and downstream from the correction device at a distance $D_1$ and $D_2$, respectively, from the correction device, $D_1$ and $D_2$ being smaller than (¼) L, where L is the length of the pole surfaces determining the multipole fields in the direction of the optical axis.

If higher-order poles are also admitted for this n-pole, in addition to the four-pole effect, a possibility is created for performing a correction of residual errors in the correction device. Moreover, better termination of the uniform fields and the quadrupole field (and, when the correction device is used for correcting the spherical aberration of the uniform fields, the quadrupole field and the hexapole field) of the correction unit can be achieved. This is because it is desirable that these fields decay identically at the ends of the poles. Furthermore, the dipole character of n-pole can be used to tilt the beam so that it can be directed as well as possible through the correction unit. Because of the requirement that the n-poles must be arranged near the correction device, stigmators normally present in the electron microscope cannot be used for this purpose. Tests performed on the system consisting of the correction device, the n-poles and the objective according to the invention have demonstrated that a satisfactory effect is obtained when $D_1$ and $D_2$ are smaller than (¼)L.

Figure 4A:
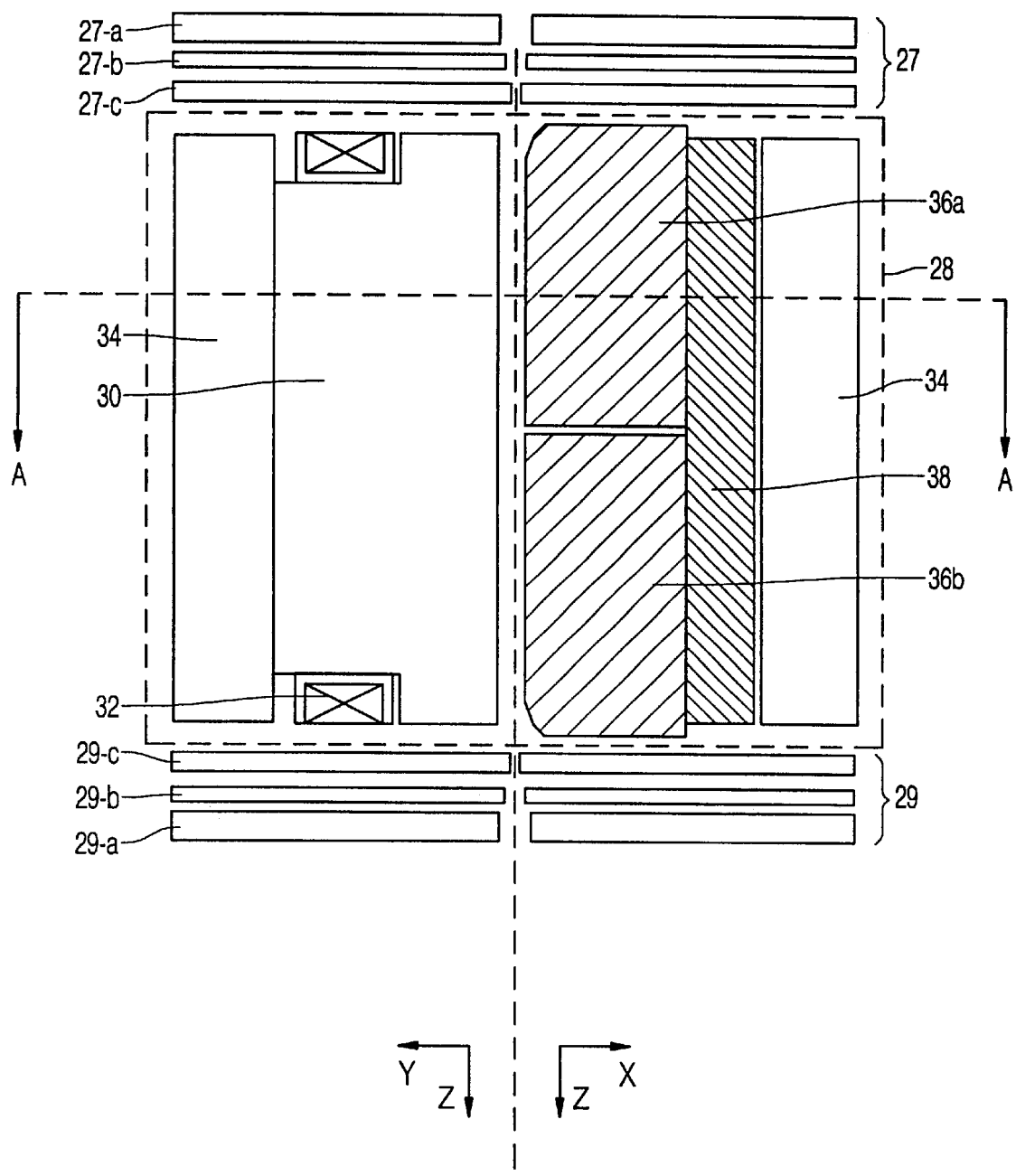
FIG. 4a is a diagrammatic cross-sectional view, partly in the x-z plane and partly in the y-z plane, of the combination of a correction device with two associated multipole devices according to the invention.

FIG. 4a is a cross-sectional view, partly in the x-z plane and partly in the y-z plane which extends perpendicularly thereto, of the combination of a correction device 28 and two associated multipole devices 27 and 29 according to the invention. The correction device consists of two pole pieces 30 (only one of which is shown in FIG. 4a) which are made of nickel iron so as to produce the uniform magnetic field, a coil 32 being provided on each pole piece. The magnetic field generated by the coils 32 and the pole pieces 30 is conducted further by a magnetic circuit 34 of nickel iron. This circuit is shaped as a cylinder whose axis is coincident with the optical axis 4. Between the magnet poles 30 there are arranged two electrode pairs 36a and 36b (only one of each pair is shown in FIG. 4a) in such a manner that the pole faces of the electrode pairs 36a and 36b extend perpendicularly to the pole faces of the magnetic pole pieces 30. All of said pole faces extend parallel to the optical axis 4. The electrode pairs 36a and 36b are electrically insulated from the other metal parts of the correction device by an insulator 38.

As has already been described, correction of the spherical aberration of the focusing lens is possible by generating a hexapole field in the correction device and by splitting the hexapole field thus formed into two equal parts, each of which amounts to half the length of the correction device, and by adding a hexapole field of opposite strength to each of said halves. Said two equal parts are in this case formed by the two electrode pairs 36a and 36b. The method of forming the hexapole field will be described in detail with reference to FIG. 4c.

Figure 4B:
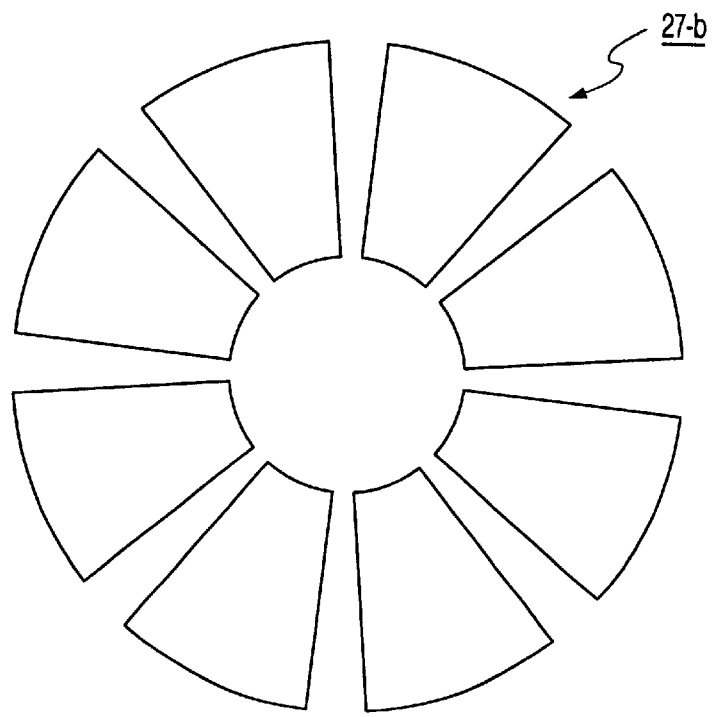
FIG. 4b is a plan view of an octupole structure for use in a multipole device according to the invention.

The two multipole devices 27 and 29 are identical in respect of construction as well as excitation, be it that one is the mirror image of the other. Therefore, only one multipole device 27 will be described. The multipole device 27 consists of successively a conductor 27-a in the form of a circular plate provided with a central bore, an octupole-like structure 27-b, and a conductor 27-c in the form of a circular plate provided with a central bore. FIG. 4b is a plan view of an embodiment of the octupole structure. This structure consists of eight electrodes in the form of a sector of circle; each of the electrodes can be supplied with its own electric voltage. The combination of the two plates 27-a and 27-c and the octupole-like structure 27-b forms the desired multipole fields which can be generated by way of a known, appropriate excitation of each of the sector-shaped electrodes. The voltages across the sector-shaped electrodes cause electrical fields between the octupole structure 27-b and the plates, it being possible to generate a variety of desirable fields by way of a suitable choice of the excitation, for example uniform fields for deflecting the beam, quadrupole fields for stigmator effects, and hexapole fields and octupole fields for correcting residual aberrations of the correction device. When the plate 27-c is made of nickel iron, it can be made to serve not only as a field termination (field clamp) for the multipole but also as a field clamp for the magnetic field of the correction device. The plate 27-a can be made of titanium and then serves as a field clamp for the multipole.

Figure 4C:
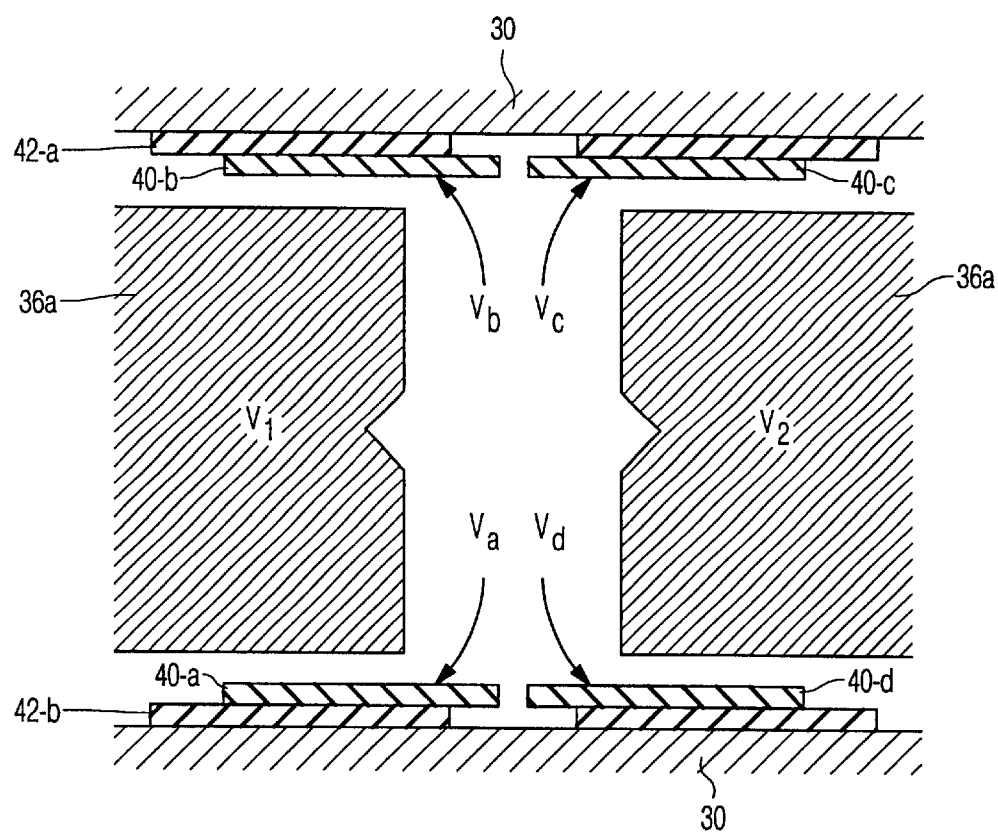

FIG. 4c is a detailed partial sectional view of the correction device 28, taken along the line A—A. The electrode pair 36a is arranged between the two magnet poles 30 in such a manner that the pole faces of this electrode pair extend perpendicularly to the pole faces of the magnetic pole pieces 30. Each of the electrodes of the electrode pair 36a is provided at its center with a V-shaped groove which extends parallel to the optical axis. This groove enhances the homogeneity of the electrical field. Two pairs of electrical electrodes 40-a, 40-d and 40-b, 40-c are provided on the pole faces of the magnetic pole pieces 30, via a substrate layer 42-a and 42-b, respectively, of an electrically insulating material. Each of said four electrodes can be supplied with its own voltage. The desired electrostatic quadrupole field can be generated by way of an appropriate choice of these voltages. To this end, the electrodes 40-a to 40d are provided with a given potential and the electrodes 36a are provided with an equally large but opposed potential. The electrostatic hexapole effect is achieved by adding to said quadrupole excitation a potential which is positive for the electrodes 40-b, d, the right-hand electrode of 36a and 40-a and negative for the other electrodes; these voltages to be superposed need not have the same absolute value. The electrodes 36-a shown can be assumed to be replaced, in the lower half the correction device (see FIG. 4a), by the electrodes 36-b. Electrostatic electrodes, such as 40-a to 40d, are also situated in the vicinity of the electrodes 36-b. As has already been stated, the desired hexapole effect for the correction of the spherical aberration is made possible by splitting the hexapole fields into two parts, each amounting to half the length, and by adding a further hexapole field to each of said halves. This can be achieved by means of the arrangement of the electrodes 36a, 36b and 40-a to 40d shown.

What is claimed is:

1. A particle-optical apparatus which includes, a particle source for producing a beam of electrically charged particles which travel along an optical axis of the apparatus in order to irradiate an object to be irradiated in the apparatus by means of the particle beam, a focusing lens for focusing the beam of electrically charged particles, and a correction device for correcting lens aberrations of the focusing lens, which correction device comprises pole faces for producing a uniform electrical field and a uniform magnetic field which extends perpendicularly thereto, both dipole fields also extending perpendicularly to the optical axis of the apparatus, which correction device also comprises pole faces for producing an electrical quadrupole field, which pole faces extend substantially parallel to the optical axis of the apparatus, the strengths of the electrical and the magnetic fields in the correction device are such that in the correction device the electrically charged particles travel along a sinusoidal trajectory which includes i full sine periods (i=0, 1, 2 . . . ) plus a sine line whose length does not deviate more than 10% from a full sine period, and that upstream as well as downstream from the correction device there is provided an n-pole where n=4, 6, . . . , which is arranged at a distance $D_1$ and $D_2$, respectively, from the correction device, $D_1$ and $D_2$ being smaller than (¼) L, where L is the length of the pole faces governing the uniform fields in the direction of the optical axis.

2. A particle-optical apparatus as claimed in claim 1, in which the electrical and the magnetic fields in the correction device have a strength such that in the correction device the electrically charged particles follow a sinusoidal trajectory which consists exclusively of a sine line whose length does not deviate more than 10% from a full sine period.

3. A particle-optical apparatus as claimed in claim 2, in which the quadrupole field is exclusively an electrical field.

4. A particle-optical apparatus as claimed in claim 3 and being a scanning particle-optical apparatus with a spot-forming objective lens, the correction device therein being arranged ahead of the objective lens, looking in the direction from the particle source.

5. A particle-optical apparatus as claimed in claim 2 and being a scanning particle-optical apparatus with a spot-forming objective lens, the correction device therein being arranged ahead of the objective lens, looking in the direction from the particle source.

6. A particle- optical apparatus as claimed in claim 1, in which the quadruple field is exclusive an electrical field.

7. A particle-optical apparatus as claimed in claim 6, and being a scanning particle-optical apparatus with a spot-forming objective lens, the correction device therein being arranged ahead of the objective lens, looking in the direction from the particle source.

8. A particle-optical apparatus as claimed in claim 1 and being a scanning particle-optical apparatus with a spot-forming objective lens, the correction device therein being arranged ahead ofthe objective lens, looking in the direction from the particle source.

9. An particle-optical assembly comprising:

a focusing lens for focusing a beam of electrically charged particles, a correction device for correcting lens aberrations of the focusing lens, which correction device comprises pole faces for producing a uniform electrical field and a uniform magnetic field which extends perpendicularly thereto, both dipole fields also extending perpendicularly to the optical axis of the apparatus, which correction device also comprises pole faces for producing an electrical quadrupole field, which pole faces extend substantially parallel to an optical axis of the apparatus, characterized in that the strengths of the electrical and the magnetic fields in the correction device are such that in the correction device the electrically charged particles travel along a sinusoidal trajectory which includes i full sine periods (i=0, 1, 2 . . . ) plus a sine line whose length does not deviate more than 10% from a full sine period, and an n-pole (which n=4, 6, . . . ) which is arranged upstream and/or downstream from the correction device at a distance $D_1$ and/or $D_2$, respectively, from the correction device, $D_1$ and $D_2$ being smaller than (¼) L, where L is the length of the pole faces governing the uniform fields in the direction of the optical axis.

10. A particle-optical apparatus as claimed in claim 9 in which the electrical and the magnetic fields in the correction device have a strength such that in the correction device the electrically charged particles follow a sinusoidal trajectory which consists exclusively of a sine line whose length does not deviate more than 10% from a full sine period.

11. A particle-optical apparatus as claimed in claim 10, in which the quadrupole field is exclusively an electrical field.

12. A particle-optical apparatus as claimed in claim 11 and being a scanning particle-optical apparatus with a spot-forming objective lens, the correction device therein being arranged ahead of the objective lens, looking in the direction of motion of particles within the beam.

13. A particle-optical apparatus as claimed in claim 10 and being a scanning particle-optical apparatus with a spot-forming objective lens, the correction device therein being arranged ahead of the objective lens, looking in the direction of motion of particles within the beam.

14. A particle-optical apparatus as claimed in claim 9, in which the quadrupole field is exclusively an electrical field.

15. A particle-optical apparatus as claimed in claim 14 and being a scanning particle-optical apparatus with a spot-forming objective lens, the correction device therein being arranged ahead of the objective lens, looking in the direction of motion of particles within the beam.

16. A particle-optical apparatus as claimed in claim 9 and being a scanning particle-optical apparatus with a spot-forming objective lens, the correction device therein being arranged ahead of the objective lens, looking in the direction of motion of particles within the beam.

* * * * *

UNITED STATES PATENT AND TRADEMARK OFFICE
CERTIFICATE OF CORRECTION

PATENT NO. : 6,246,058 B1
DATED : June 12, 2001
INVENTOR(S) : Peter C. Tiemeijer It is certified that error appears in the above-identified patent and that said Letters Patent is hereby corrected as shown below:

<u>Title page,</u>
Item [57], ABSTRACT
Line 1, please insert -- Particle-optical rotationally-symmetrical lenses inevitably suffer from chromatic aberration. This lens defect determines the limit of the resolution of known -- at the beginning of the Abstract.

<u>Column 13,</u>
Line 30, delete "quadruple" and insert -- quadrupole -- therefor.
Line 30, delete "exclusive" and insert -- exclusively -- therefor.

Signed and Sealed this

Twenty-fifth Day of June, 2002

*Attest:*

*Attesting Officer*

JAMES E. ROGAN
*Director of the United States Patent and Trademark Office*